(12) United States Patent
O'Sullivan

(10) Patent No.: US 8,952,762 B2
(45) Date of Patent: Feb. 10, 2015

(54) CLOCK-OUT AMPLITUDE CALIBRATION SCHEME TO ENSURE SINE-WAVE CLOCK-OUT SIGNAL

(75) Inventor: Tomas O'Sullivan, San Diego, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 12/952,102

(22) Filed: Nov. 22, 2010

(65) Prior Publication Data

US 2011/0286561 A1    Nov. 24, 2011

Related U.S. Application Data

(60) Provisional application No. 61/263,245, filed on Nov. 20, 2009.

(51) Int. Cl.
| | | |
|---|---|---|
| *H03B 5/32* | (2006.01) | |
| *H03L 5/00* | (2006.01) | |
| *H03G 3/30* | (2006.01) | |

(52) U.S. Cl.
CPC .. *H03G 3/30* (2013.01); *H03L 5/00* (2013.01); *H03B 5/32* (2013.01); *H03G 3/3089* (2013.01)
USPC .......................................... 331/160; 331/183

(58) Field of Classification Search
USPC ........... 331/116 FE, 116 M, 116 R, 154, 158, 331/160, 182, 183
See application file for complete search history.

(56) References Cited

U.S. PATENT DOCUMENTS

| | | | | |
|---|---|---|---|---|
| 7,098,753 | B1 * | 8/2006 | Dumitrescu et al. .......... | 331/182 |
| 7,123,113 | B1 * | 10/2006 | Brennan et al. ................ | 331/158 |
| 7,138,881 | B2 * | 11/2006 | Lin ................................ | 331/158 |
| 7,292,114 | B2 * | 11/2007 | Greenberg ..................... | 331/158 |
| 7,332,979 | B2 * | 2/2008 | Connell et al. ................ | 331/183 |
| 7,859,353 | B2 * | 12/2010 | Liu et al. ........................ | 331/160 |
| 7,859,355 | B2 * | 12/2010 | Brennan et al. ............... | 331/183 |
| 2005/0127947 | A1 | 6/2005 | Arnold et al. | |
| 2006/0176985 | A1 | 8/2006 | Tandon et al. | |
| 2008/0103719 | A1 | 5/2008 | Seong | |

FOREIGN PATENT DOCUMENTS

WO    2011/063352 A1    5/2011

OTHER PUBLICATIONS

International Preliminary Report on Patentability with Written Opinion for PCT Application No. PCT/US2010/057671, mailed May 31, 2012; 6 pages.
International Search Report and Written Opinion mailed on Jan. 21, 2011 for Patent Application No. PCT/US2010/057671, 11 pages.

\* cited by examiner

*Primary Examiner* — Levi Gannon
(74) *Attorney, Agent, or Firm* — Kilpatrick Townsend & Stockton LLP

(57) ABSTRACT

A clock generator includes, in part, a buffer, a peak detector and a control logic. The buffer generates a clock output signal in response to receiving a clock signal and a feedback signal that controls the gain of the buffer. If the peak detector detects that the amplitude of the output signal is higher than the upper bound of the predefined range, the gain value applied to the variable buffer is decreased. If the peak detector detects that the amplitude of the output signal is lower than the lower bound of the predefined range, the gain value applied to the variable buffer to increased. If the peak detector detects that the amplitude of the output signal is within the predefined range, no change is made to the gain value applied to the variable buffer. The control logic generates the feedback signal in response to the peak detector's output signal.

13 Claims, 2 Drawing Sheets

CLOCK-OUT AMPLITUDE CALIBRATION SCHEME TO ENSURE SINE-WAVE CLOCK-OUT SIGNAL

CROSS-REFERENCES TO RELATED APPLICATIONS

The present application claims benefit under 35 USC 119(e) of U.S. provisional application No. 61/263,245, filed Nov. 20, 2009, entitled "CLOCK-OUT AMPLITUDE CALIBRATION SCHEME TO ENSURE SINE-WAVE CLOCK-OUT SIGNAL," the content of which is incorporated herein by reference in its entirety.

BACKGROUND OF THE INVENTION

The present invention relates to integrated circuits (ICs), and more particularly to generating reference clock signals within ICs.

Crystal oscillator circuits are used in a variety of digital and analog circuit applications. In particular, analog circuit applications of crystal oscillators include communication systems which use a sinusoidal (or sine wave) output signal from a crystal oscillator. In some communication systems the crystal oscillator may be tunable in frequency. At the selected frequency, the sine wave signal produced by the crystal oscillator is ideally represented in the frequency domain by only the desired frequency component. Any frequency components present in the crystal oscillator's output signal other than the selected frequency, are considered harmonics and can cause problems in the system.

BRIEF SUMMARY OF THE INVENTION

In accordance with one embodiment of the present invention, a clock signal generator includes, in part, a variable gain buffer, a peak detector and a control logic. The variable gain buffer is adapted to generate a clock output signal in response to receiving a clock signal and a feedback signal that defines the gain of the buffer. The peak detector is adapted to detect whether the amplitude of the output signal falls within or outside a predefined range. The control logic generates the feedback signal in response to the peak detector's output signal. If the peak detector detects that the amplitude of the output signal is higher than the upper bound of the predefined range, it causes the control logic to decrement the count of a counter disposed in the control logic, which in turn causes the gain value applied to the variable buffer to decreases. If the peak detector detects that the amplitude of the output signal is lower than the lower bound of the predefined range, it causes the control logic to increment the counter's count, which in turn causes the gain value applied to the variable buffer to increase. If the peak detector detects that the amplitude of the output signal is within the predefined range, it causes the control logic to maintain the counter's count, thus causing no change in the gain value applied to the variable buffer.

A method of controlling an output signal, in accordance with one embodiment of the present invention includes, in part, generating the output signal via a buffer in response to receiving a clock signal and a feedback signal, detecting whether an amplitude of the output signal falls within or outside a predefined range, and varying a gain of the buffer using the feedback signal when the amplitude of the output signal is detected as falling outside the predefined range.

In one embodiment, the method further includes, in part, decrementing a counter's count in response to detecting that the output signal is higher than the upper bound of the predefined range, incrementing the count in response to detecting that the output signal is lower than the lower bound of the predefined range, and maintaining the count in response to detecting that the output signal is within the predefined range. In one embodiment, the method further includes, in part, supplying the clock signal via a crystal oscillator. In one embodiment, the clock signal used to increment or decrement the counter is supplied by the crystal oscillator. In one embodiment, the feedback signal is an n-bit signal providing $2^N$ discrete gain values to the buffer.

DETAILED DESCRIPTION OF THE INVENTION

The output signal of a crystal oscillator circuit may not have sufficient drive to directly drive the required loads presented by other circuits in an integrated circuit. A buffer amplifier (also referred to herein as buffer) coupled to the crystal oscillator's output may be used to provide the drive capability lacking in the crystal oscillator's output. However, the buffer may introduce harmonic frequency components in the amplified crystal oscillator signal if the buffer operates in a non-linear region of operation, for instance, when the signal level is outside a nominal amplitude range. Further, variations in environmental conditions and power supply voltages may cause the crystal oscillator output signal to vary in amplitude. As a result, the crystal oscillator's output signal may, in turn, cause the buffer to operate non-linearly when the amplitude of the crystal oscillator's output signal deviates from the buffer's nominal input range for linear operation. A filter coupled to the buffer output may be used to attenuate the harmonics produced by the buffer. However, crystal oscillators are capable of operating up to 50 Mhz. Thus, harmonic components in the amplified oscillator signal may have a frequency of, for example, 100 Mhz. As is known, lower frequency harmonics pose a challenging task for filtering on-chip since relatively large capacitor and resistor values are required.

Figure 1:
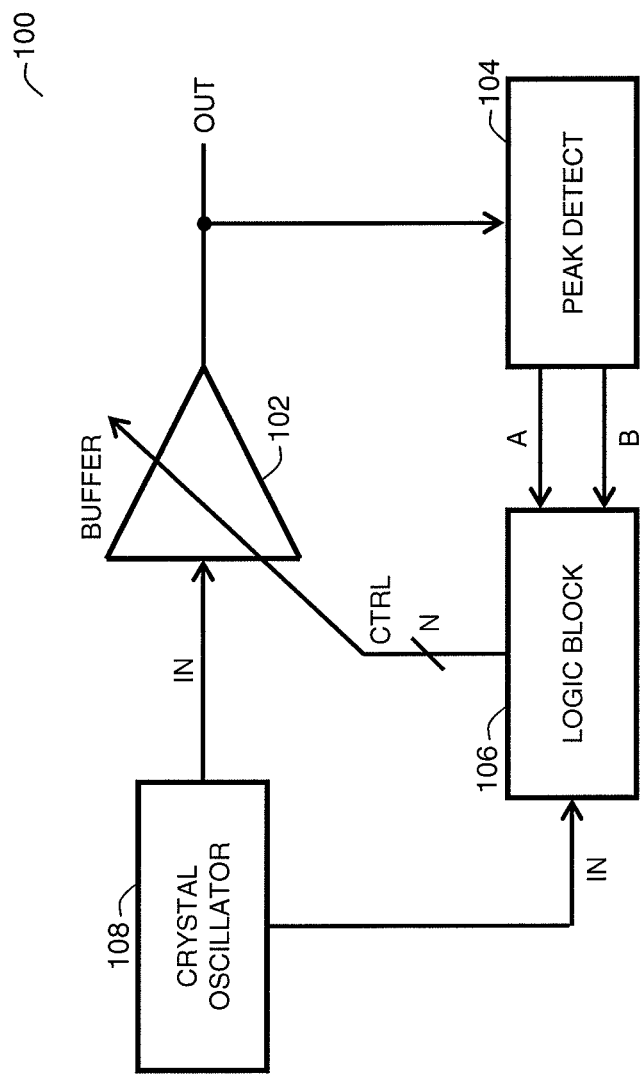
FIG. 1 is a block diagram of a control circuit adapted to control the amplitude of a clock signal, in accordance with one embodiment of the present invention.

FIG. 1 is a block diagram of a control circuit 100 adapted to control the amplitude of its output signal OUT, in accordance with one embodiment of the present invention. System 100 is shown as including a buffer 102, a peak detector 104, and a logic block 106. Crystal oscillator 108 provides the input signal IN to buffer 102 and logic block 106. Buffer 102, which has a variable gain controlled by logic block 106, amplifies its input signal in accordance with the gain value that buffer 102 receives from logic block 106 to generate the output signal Out.

Peak detector 104 is adapted to detect the peak-to-peak amplitude swings of signal Out and supply these peak levels to logic block 106. Logic block 106 compares the detected peaks to a predefined minimum (also referred to herein as a lower bound) and a maximum level (also referred to herein as an upper bound) which together define a window (alternatively referred to herein as range) of operation. In response, logic block 106 adjusts the gain of buffer 102 to keep the amplitude of signal Out within the window of operation while maintaining the buffer 102 in the linear region of operation with low harmonic content for signals Out.

As described above, buffer 102 linearly amplifies input signal In to generate the output signal Out. The gain of buffer 102 is set by logic block 106. Peak detector 104 provides the high and low levels of the detected amplitude peaks to logic block 106. Logic block 106 continuously monitors these peaks. If the amplitude of signal Out is detected as being greater than the upper bound of the defined window or smaller than the lower bound of the defined window, logic block 106 varies the gain of buffer 102 so as to cause the amplitude of signal Out to be within the window. Accordingly, the amplitude of output signal Out is maintained within the pre-determined window to meet the minimum signal requirements while preventing non-linear behavior in the buffer 102. By maintaining buffer 102 in the linear mode of operation, low harmonic content is maintained for signal Out. Accordingly, embodiments of the present invention provide a robust clock amplitude control across various crystal frequencies and input swing levels.

Peak detector 104 is shown as including first and second output signals, A and B respectively, coupled to logic block 106. Signals A and B may carry any number of bits and represent any number of states. For the example shown in FIG. 1, signals A and B represent four states, three of which are valid. These three states cause logic block 106 to increase, decrease, or maintain the gain of buffer 102, as described further below.

When the amplitude of signal Out is detected by peak detector 104 as being greater than the upper bound of the predefined range, the peak detector transmits on signals A and B a command to cause logic block 106 to decrement or reduce the gain of variable gain buffer 102 until the amplitude of signal Out is detected as falling within the predefined range. When the amplitude of signal Out is detected by peak detector 104 as being smaller than the lower bound of the predefined range, the peak detector transmits on signals A and B a command to cause logic block 106 to increment or increase the gain of variable gain buffer 102 until the amplitude of signal Out is detected as falling within the predefined range. If the amplitude of signal Out is detected by peak detector 104 as falling within the predefined range, the peak detector transmits on signals A and B a command to cause the logic block to maintain the gain of variable gain buffer 102 at its level. The signal Out is thus continuously monitored and adjusted as needed to maintain its amplitude within the predefined window for linear amplification and to prevent unwanted harmonic generation.

In one embodiment, logic block 106 controls the gain of variable gain buffer 102 digitally. In this embodiment, variable gain buffer 102 receives one of $2^N$ discrete gain settings (also referred to herein as values) from logic block 106, where N is an integer. For example, if N=4 bits, the gain of the variable gain buffer may be selected from one of sixteen discrete gain settings. One of the $2^N$ discrete gain settings may have a gain step size less than the sum of the predefined window and a predefined margin to improve stability of system 100. For example, the gain step size may be less than {(maximum level−minimum level)+predefined margin}, where the predefined margin is added for practical design reasons.

Figure 2:
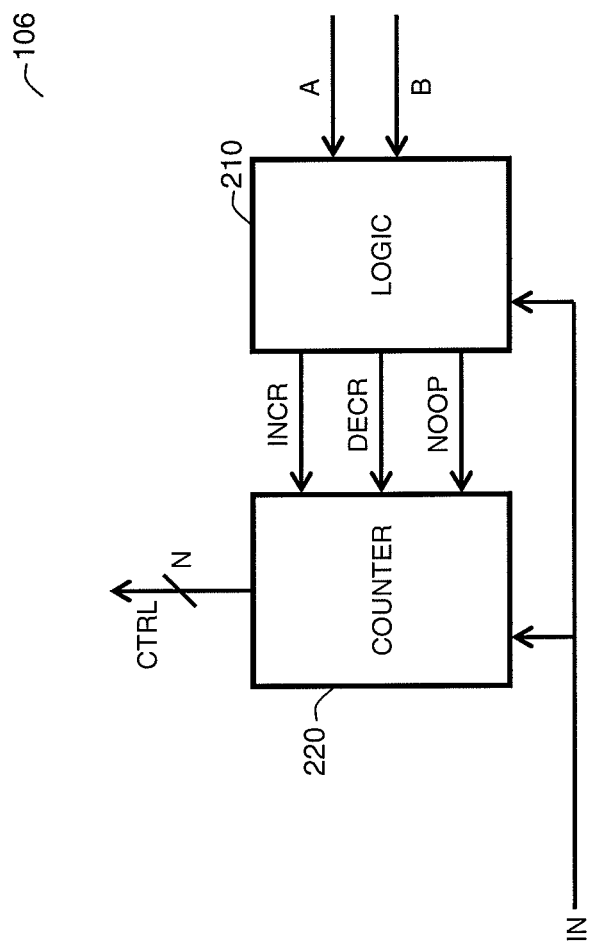
FIG. 2 is a block diagram of a logic circuit adapted to control the gain of the buffer of FIG. 1, in accordance with one embodiment of the present invention.

FIG. 2 is an exemplary block diagram of logic block 106, in accordance with one embodiment of the present invention. Logic block 106 is shown as including a logic circuit 210 and a counter 220. Logic circuit 210 receives the output signals A and B of the peak detector which collectively determine whether to increment, decrement or maintain the count of N-bit counter 220. To achieve this, logic circuit 210 receives signals A and B, which together carry information as to either decrement, increment or maintain the gain of the variable gain buffer, and activates one of the signal lines DECR, INCR or NOOP applied to input terminals of counter 220. Counter 220 continues to increment (or decrement) its count in response to each low-to-high (or high-to-low) transition of a clock signal that is generated by dividing the clock signal IN. When signal INCR is asserted, counter 220's count is increased, which in turn, causes a corresponding increase in the gain value supplied to buffer 102 via N-bit signal CTRL. When signal DECR is asserted, counter 220's count is decreased, which in turn, causes a corresponding decrease in the gain value supplied to buffer 102 via N-bit signal CTRL. When signal NOOP is asserted, counter 220's count and thus the gain value applied to buffer 102 is not changed. With each new count of counter 220, whether the change in count is caused by the transitions of the divided version of clock signal IN or by the output signals of the peak detector, the value of the gain control signal CTRL applied to buffer 102 changes.

The above embodiments of the present invention are illustrative and not limitative. Various alternatives and equivalents are possible. The embodiments of the present invention are not limited by the number of bits used to control the gain of the buffer. The embodiments of the present invention are not limited by the logic circuit or the type of counter used in the logic block. The embodiments of the present invention are not limited by the voltage levels applied to the buffer. Nor are the embodiments of the present invention limited by the peak detector used to monitor the signal Out. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a clock signal generator. Other additions, subtractions or modifications are obvious in view of the present invention and are intended to fall within the scope of the appended claims.

What is claimed is:

1. A clock signal generator comprising:
   a variable gain buffer adapted to generate an output signal in response to a clock signal and a feedback signal;
   a peak detector responsive to the variable gain buffer and adapted to detect whether an amplitude of the output signal falls within a predefined range; and
   a control logic responsive to the peak detector and to the clock signal and adapted to vary a gain of the variable gain buffer using the feedback signal so as to maintain the amplitude of the output signal within the predefined range, wherein the control logic comprises a counter adapted to increment, decrement or maintain its count in response to the peak detector's output signal, and wherein in response to an increment of the counter's count, the gain of the variable gain buffer increases.

2. The clock signal generator of claim 1 further comprising a crystal oscillator supplying the clock signal to the variable gain buffer and the control logic.

3. The clock signal generator of claim 1 wherein the feedback signal is an n-bit signal providing $2^N$ discrete gain values to the variable gain buffer.

4. The clock signal generator of claim 3 wherein one of the $2^N$ discrete gain values has a gain step size less than the sum of the predefined range and a predefined margin.

5. The clock signal generator of claim 1 wherein the peak detector comprises a plurality of output signals representing a command.

6. The clock signal generator of claim 5 wherein the command causes the control logic to increase or decrease a gain of the variable gain buffer.

7. The clock signal generator of claim 1 wherein the feedback signal maintains the variable gain buffer in a linear operating region.

8. A method of controlling an output signal, the method comprising:
   generating the output signal via a variable gain buffer in response to a clock signal and a feedback signal;
   detecting using a peak detector responsive to the variable gain buffer whether an amplitude of the output signal falls within a predefined range; and
   varying a gain of the variable gain buffer using the feedback signal and the clock signal so as to maintain the output signal within the predefined range;
   incrementing, decrementing or maintaining a count in response to the output signal; and
   increasing the gain in response to the increment of the count.

9. The method of claim 8 further comprising:
   supplying the clock signal using a crystal oscillator.

10. The method of claim 9 further comprising:
    incrementing a count in response to the crystal oscillator;
    decrementing the count in response to crystal oscillator; and
    maintaining the count in response to the crystal oscillator.

11. The method of claim 10 wherein the feedback signal is an n-bit signal providing $2^N$ discrete gain values to the buffer.

12. The method of claim 11 wherein one of the $2^N$ discrete gain values has a gain step size less than the sum of the predefined range and a predefined margin.

13. The method of claim 8 further comprising:
    maintaining the variable gain buffer in a linear operating region.

* * * * *